(12) United States Patent
Yasuda et al.

(10) Patent No.: US 8,930,428 B2
(45) Date of Patent: Jan. 6, 2015

(54) RANDOM NUMBER GENERATION CIRCUIT

(75) Inventors: Shinichi Yasuda, Kawasaki (JP); Kazutaka Ikegami, Fuchu (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 340 days.

(21) Appl. No.: 13/428,150

(22) Filed: Mar. 23, 2012

(65) Prior Publication Data

US 2012/0221616 A1 Aug. 30, 2012

Related U.S. Application Data

(63) Continuation of application No. PCT/JP2009/066973, filed on Sep. 29, 2009.

(51) Int. Cl.
*G06F 7/58* (2006.01)
*H03K 3/84* (2006.01)

(52) U.S. Cl.
CPC . *H03K 3/84* (2013.01); *G06F 7/588* (2013.01)
USPC .......................................... 708/251; 708/255

(58) Field of Classification Search
CPC .................................. G06F 7/58; G06F 7/588
USPC ......................................... 708/250, 251, 255
See application file for complete search history.

(56) References Cited

U.S. PATENT DOCUMENTS

| | | | |
|---|---|---|---|
| 2005/0038840 A1* | 2/2005 | Miller, Jr. ..................... | 708/250 |
| 2009/0177725 A1 | 7/2009 | Ikegami et al. | |
| 2009/0222502 A1 | 9/2009 | Ikegami et al. | |
| 2009/0265112 A1* | 10/2009 | Wilber et al. .................... | 702/19 |
| 2011/0169579 A1* | 7/2011 | Dodrill .......................... | 331/46 |

FOREIGN PATENT DOCUMENTS

| | | |
|---|---|---|
| EP | 0 805 553 A1 | 11/1997 |
| JP | 2003-108363 A | 4/2003 |
| JP | 2004-288159 A | 10/2004 |
| JP | 2005-91108 A | 4/2005 |
| JP | 2007-110460 A | 4/2007 |
| JP | 2007-520959 A | 7/2007 |
| JP | 2008-052545 A | 3/2008 |
| JP | 2008-176698 A | 7/2008 |

OTHER PUBLICATIONS

International Search Report dated Dec. 15, 2009 from PCT/JP2009/066973.
Japanese Office Action (with English translation) dated Dec. 11, 2012 from corresponding JP 2011-533986, 4 pages.
English Translation of IPRP dated Apr. 26, 2012 from PCT/JP2009/066973.

\* cited by examiner

*Primary Examiner* — Chuong D Ngo
(74) *Attorney, Agent, or Firm* — Ohlandt, Greeley, Ruggiero & Perle, L.L.P.

(57) ABSTRACT

According to one embodiment, a random number generation circuit includes an oscillation circuit and a holding circuit. The oscillation circuit has an amplifier array and a high-noise circuit. Amplifiers are connected in series in the amplifier array, and the amplifier array has a terminal between neighboring amplifiers. The high-noise circuit is inserted between other neighboring amplifiers in the amplifier array, and the high-noise circuit generates noise required to generate jitter in an oscillation signal from the amplifier array. The holding circuit outputs, as a random number, the oscillation signal held according to a clock signal.

6 Claims, 13 Drawing Sheets

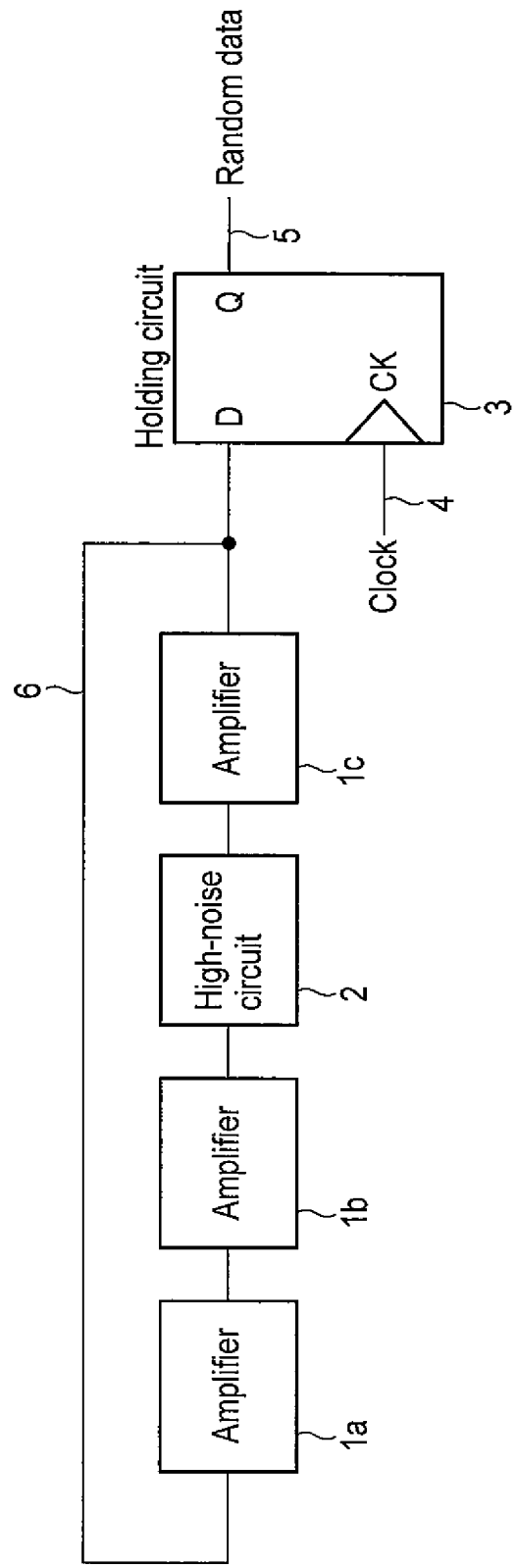
F I G. 1

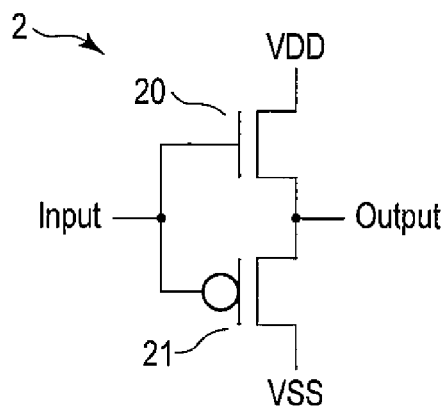
F I G. 3
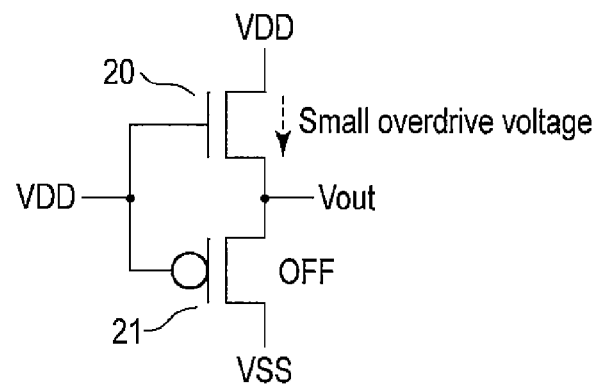
F I G. 4 A
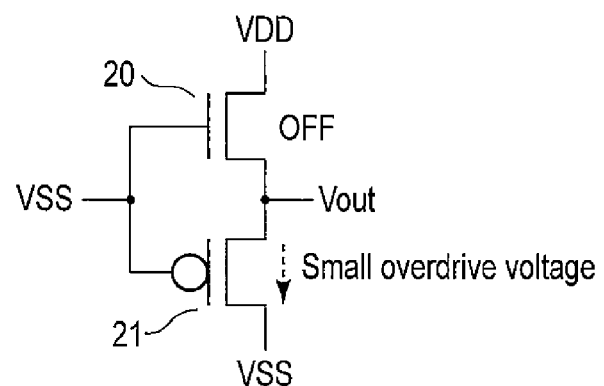
F I G. 4 B

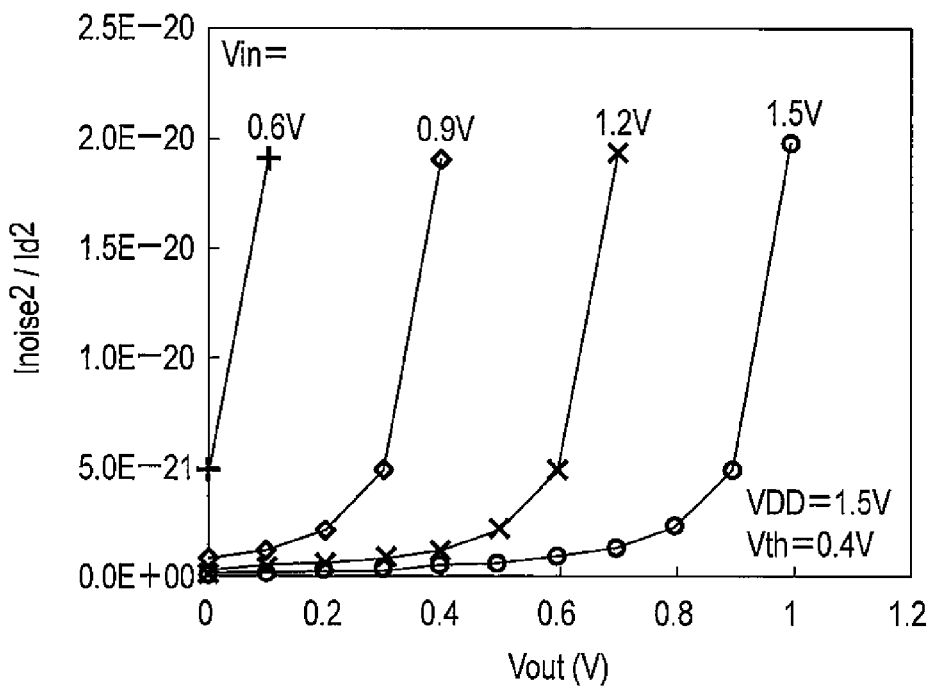
F I G. 5
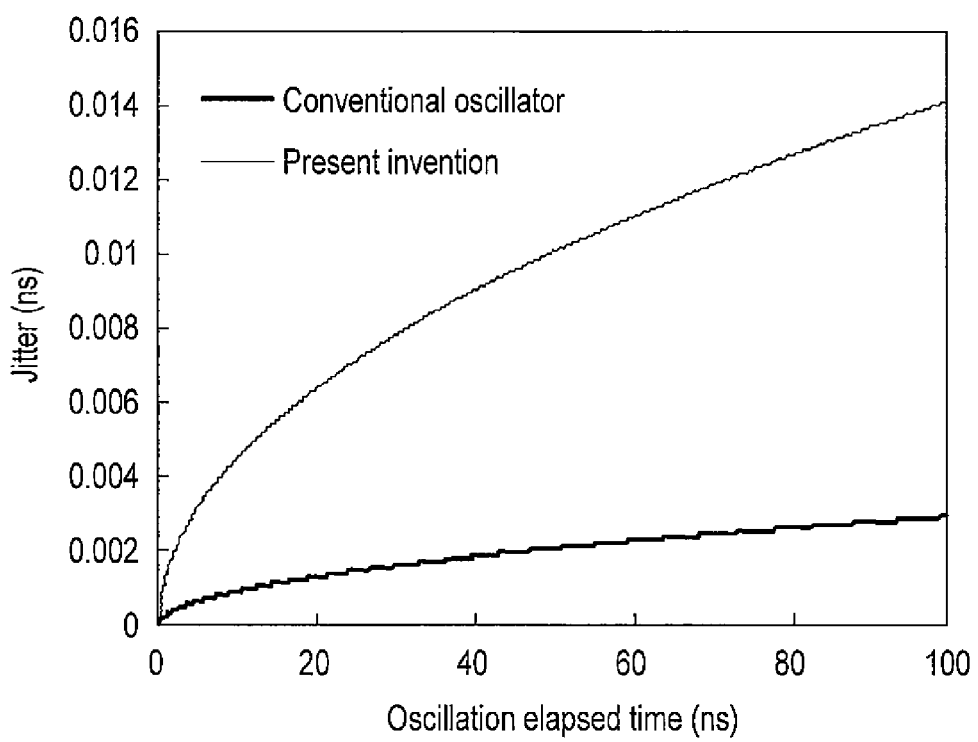
F I G. 6

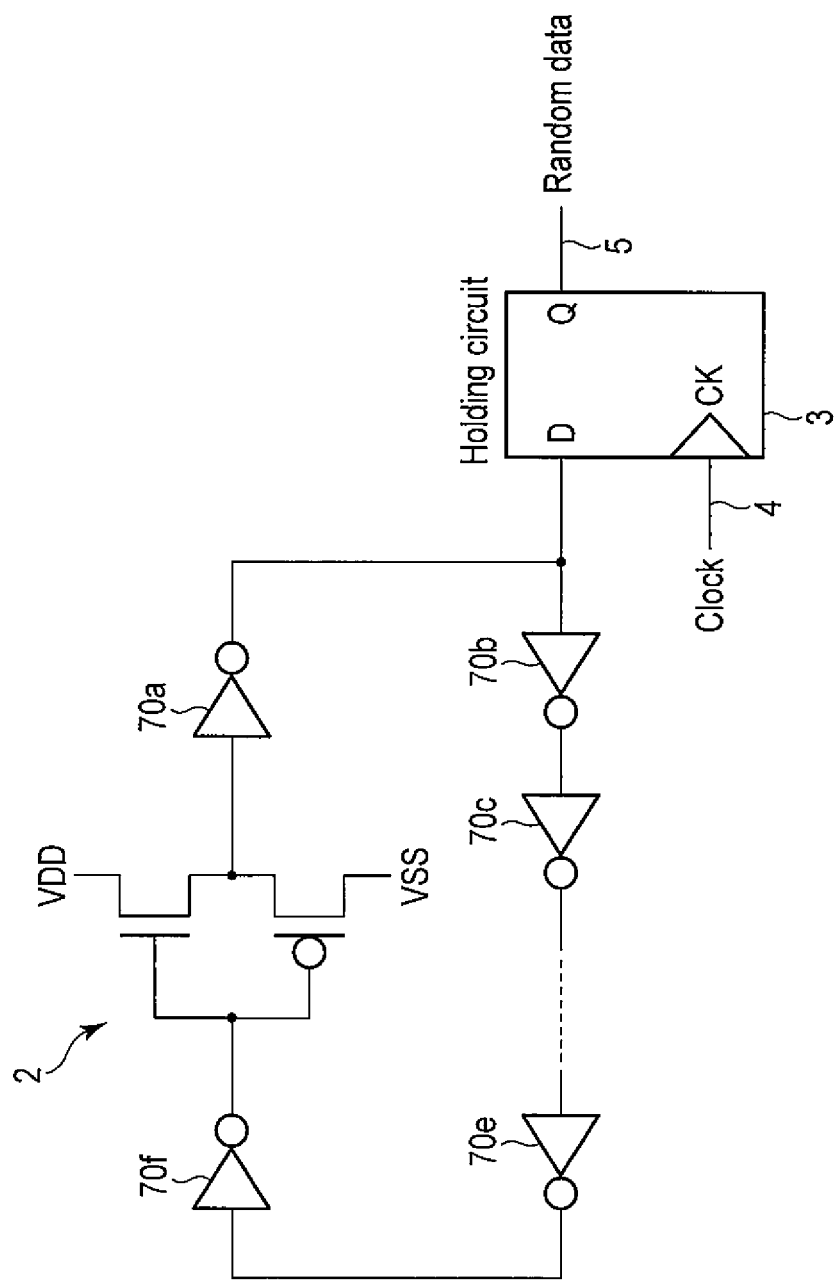
F I G. 7

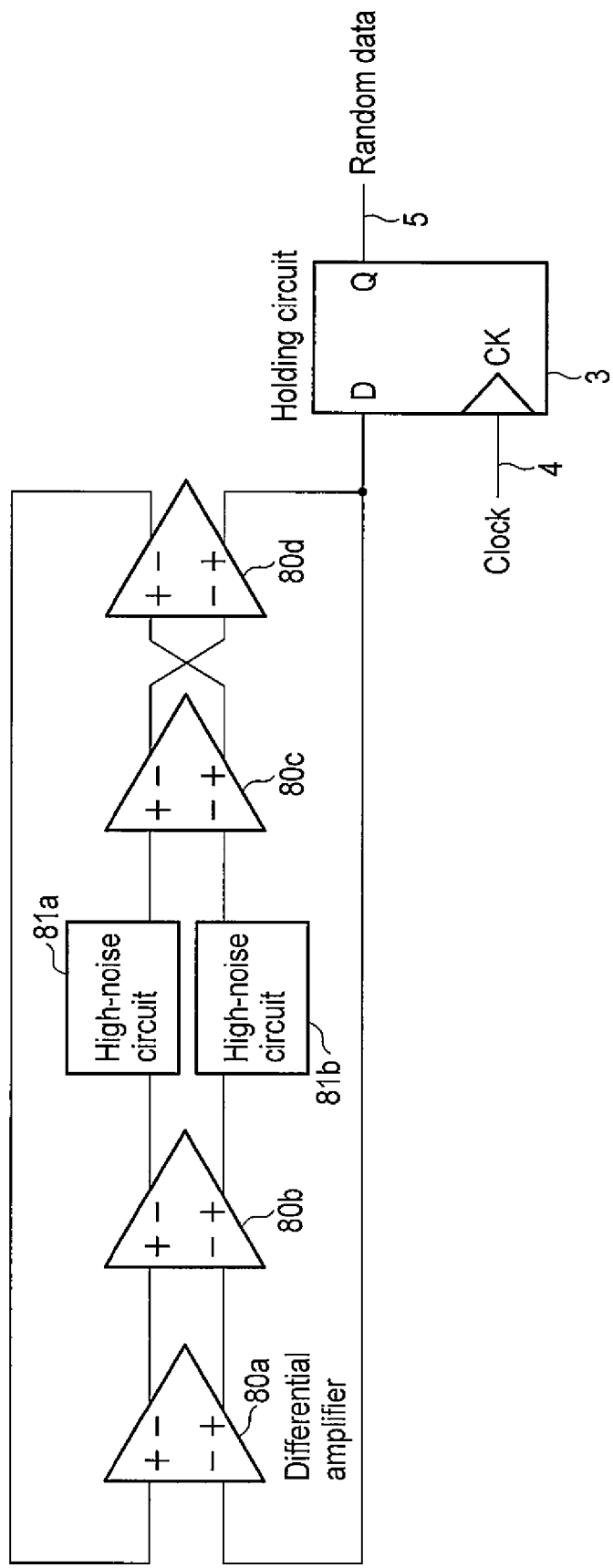
F I G. 8

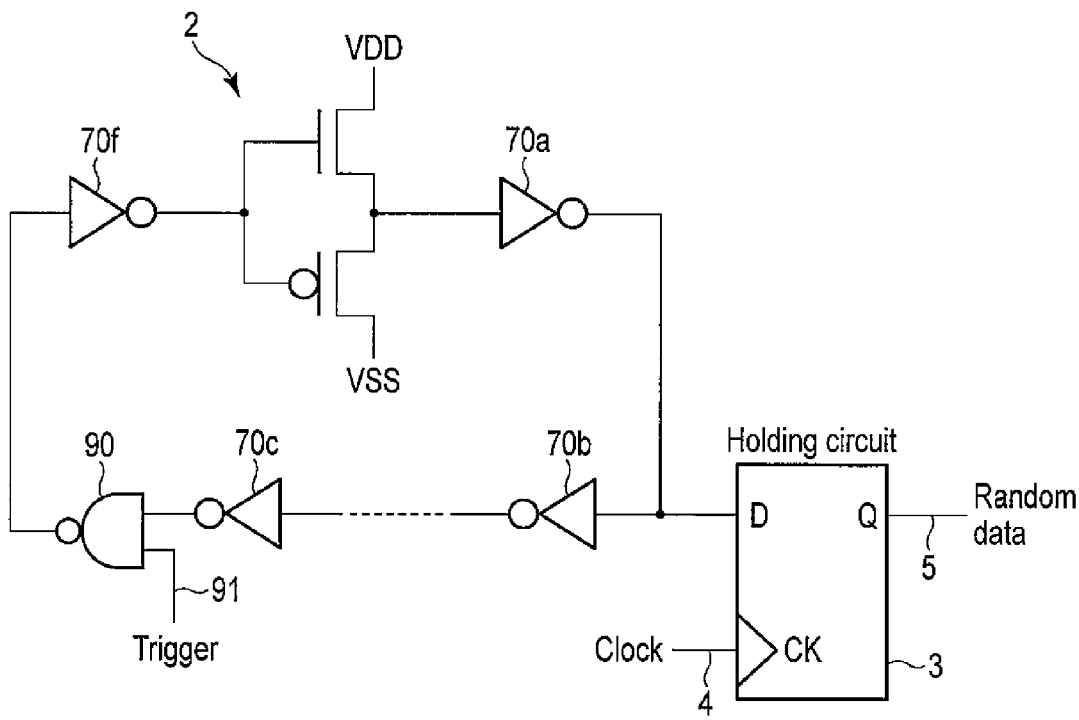
F I G. 9
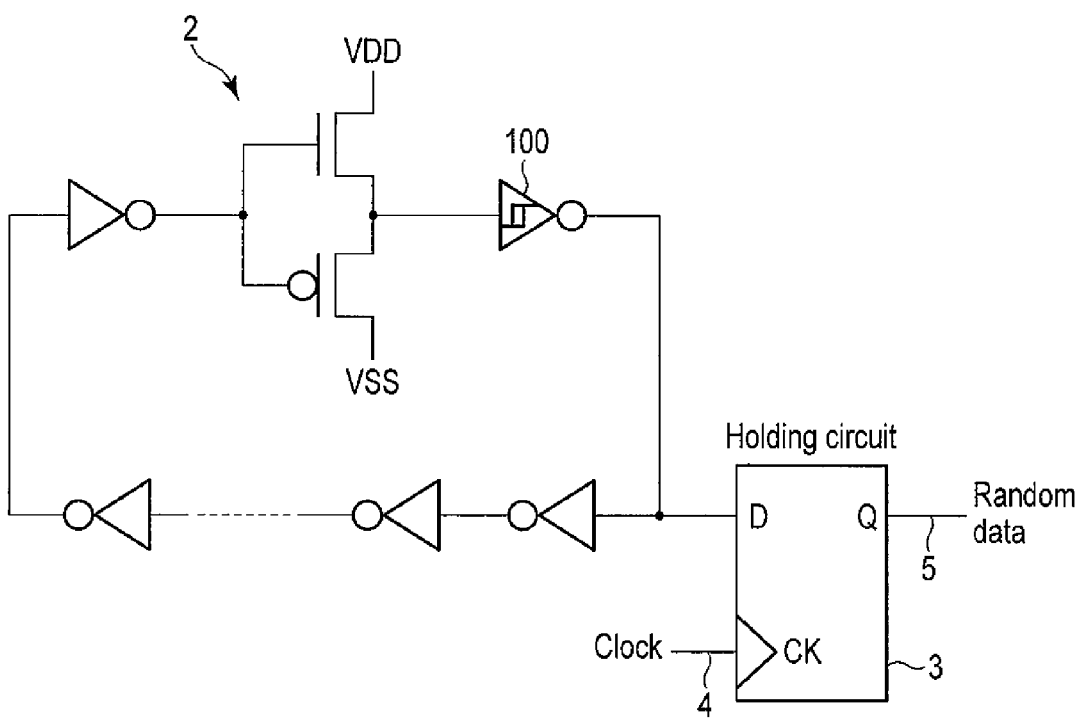
F I G. 10

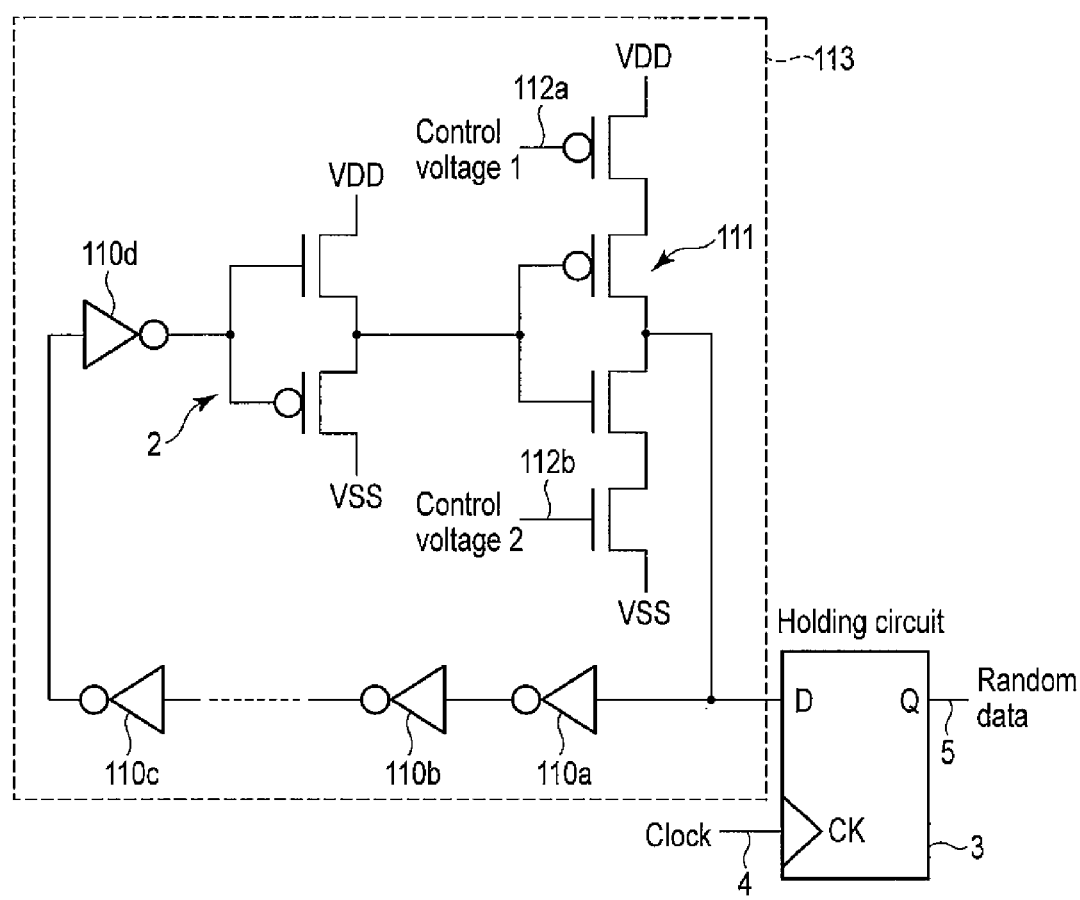
F I G. 11

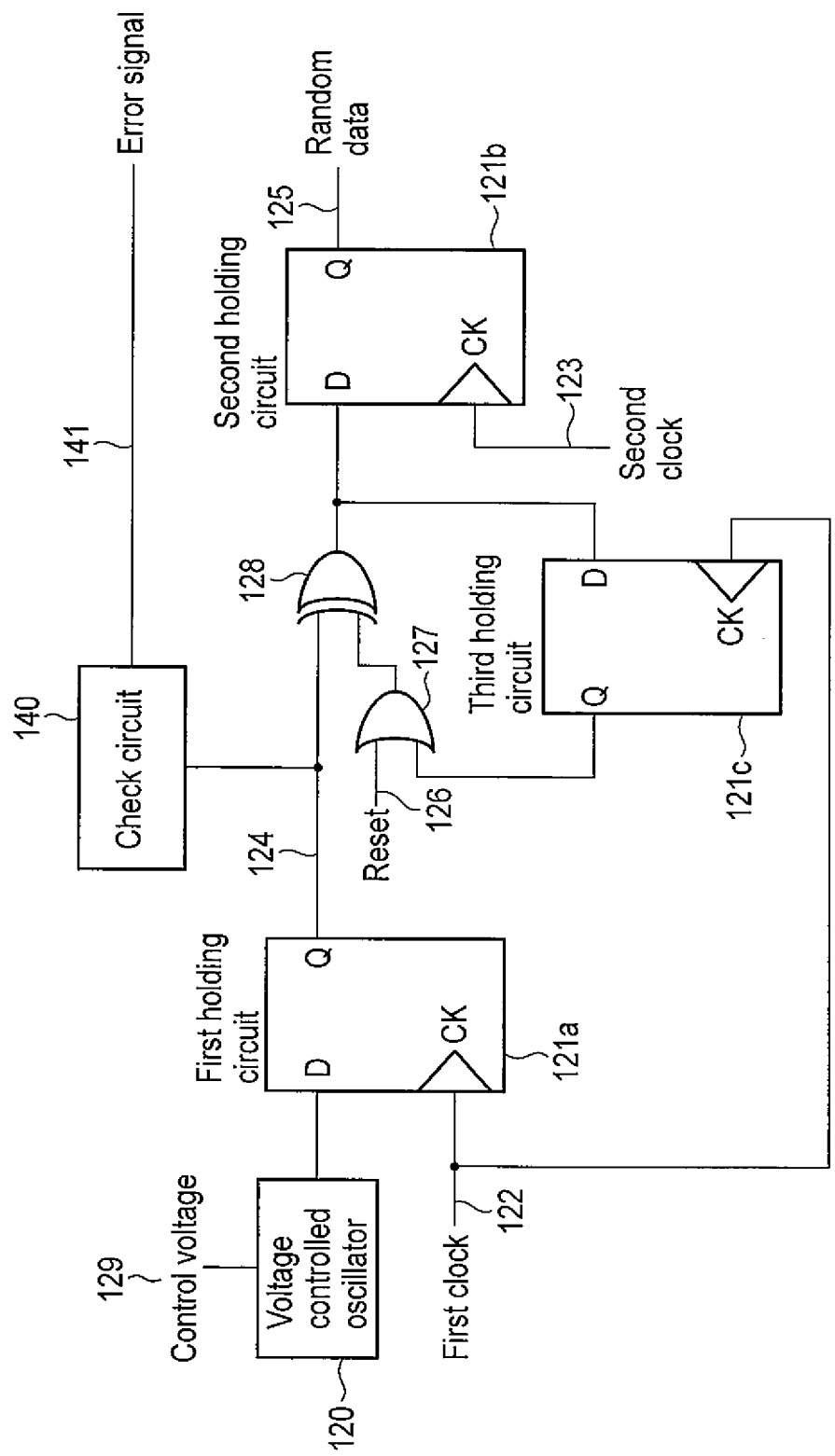
F I G. 14

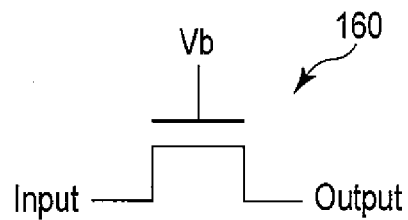
F I G. 1 6
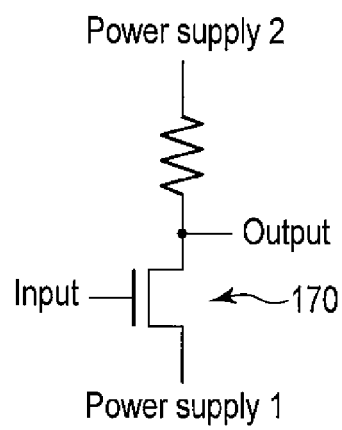
F I G. 1 7
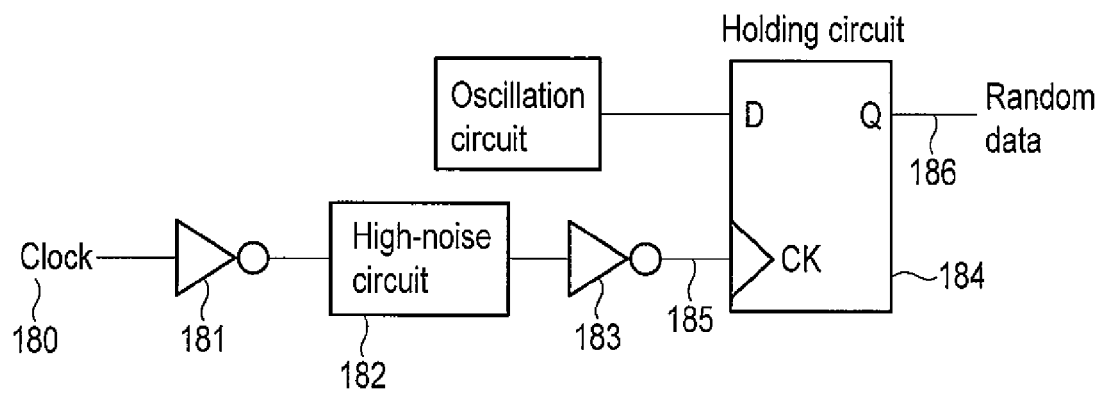
F I G. 1 8

RANDOM NUMBER GENERATION CIRCUIT

CROSS-REFERENCE TO RELATED APPLICATIONS

This application is a Continuation application of PCT Application No. PCT/JP2009/066973, filed Sep. 29, 2009, the entire contents of which are incorporated herein by reference.

FIELD

Embodiments described herein relate generally to a random number generation circuit for generating random numbers.

BACKGROUND

Along with developments of information communication technologies, requirements for information securities become stronger. Since an unpredictability in an information security technique depends on the quality of random numbers used, a performance of a random number generation circuit is very important. Roughly two different types of random number generation methods are available. A first method generates a pseudo random number sequence based on an algorithm, and a second method generates a random number sequence based on physical uncertain factors.

As a well-known method of generating random numbers using physical phenomena, a method of latching a fast oscillation signal by clocks sufficiently lower than that signal is available. When jitter is superposed on the fast oscillation signal, since a phase of the oscillation signal fluctuates with respect to clock timings, random outputs can be obtained. However, since the magnitude of the jitter is generally very smaller than an oscillation cycle, oscillation has to be repeated many times, thus posing a problem of an increase in consumption power accordingly. In order to reduce the consumption power, the number of oscillation times has to be reduced. For this purpose, the jitter has to have a larger magnitude with respect to the oscillation cycle, thereby improving the random number generation efficiency.

BRIEF DESCRIPTION OF THE DRAWINGS

FIG. 1 is a block diagram showing a random number generation circuit according to an embodiment.

FIG. 3 is a circuit diagram showing a high-noise circuit.

FIG. 4A is a circuit diagram for explaining the operation of the high-noise circuit.

FIG. 4B is a circuit diagram for explaining the operation of the high-noise circuit.

FIG. 5 is a graph which plots ratios of noise currents.

FIG. 6 is a graph showing estimations of jitter magnitudes.

FIG. 7 is a circuit diagram showing a case in which a ring oscillator including CMOS inverters is used.

FIG. 8 is a circuit diagram showing a case in which differential amplifiers are used.

FIG. 9 is a circuit diagram showing a case in which one of inverters is replaced by a NAND gate.

FIG. 10 is a circuit diagram showing a case in which a circuit having a Schmidt trigger input is connected.

FIG. 11 is a circuit diagram showing a case in which a voltage-controlled CMOS inverter is used instead.

FIG. 14 is a circuit diagram showing a case in which a check circuit is added.

FIG. 16 is a circuit diagram showing another example of the high-noise circuit.

FIG. 17 is a circuit diagram showing still another example of the high-noise circuit.

FIG. 18 is a circuit diagram showing a case in which jitter is superposed on a clock signal.

DETAILED DESCRIPTION

Figure 2:
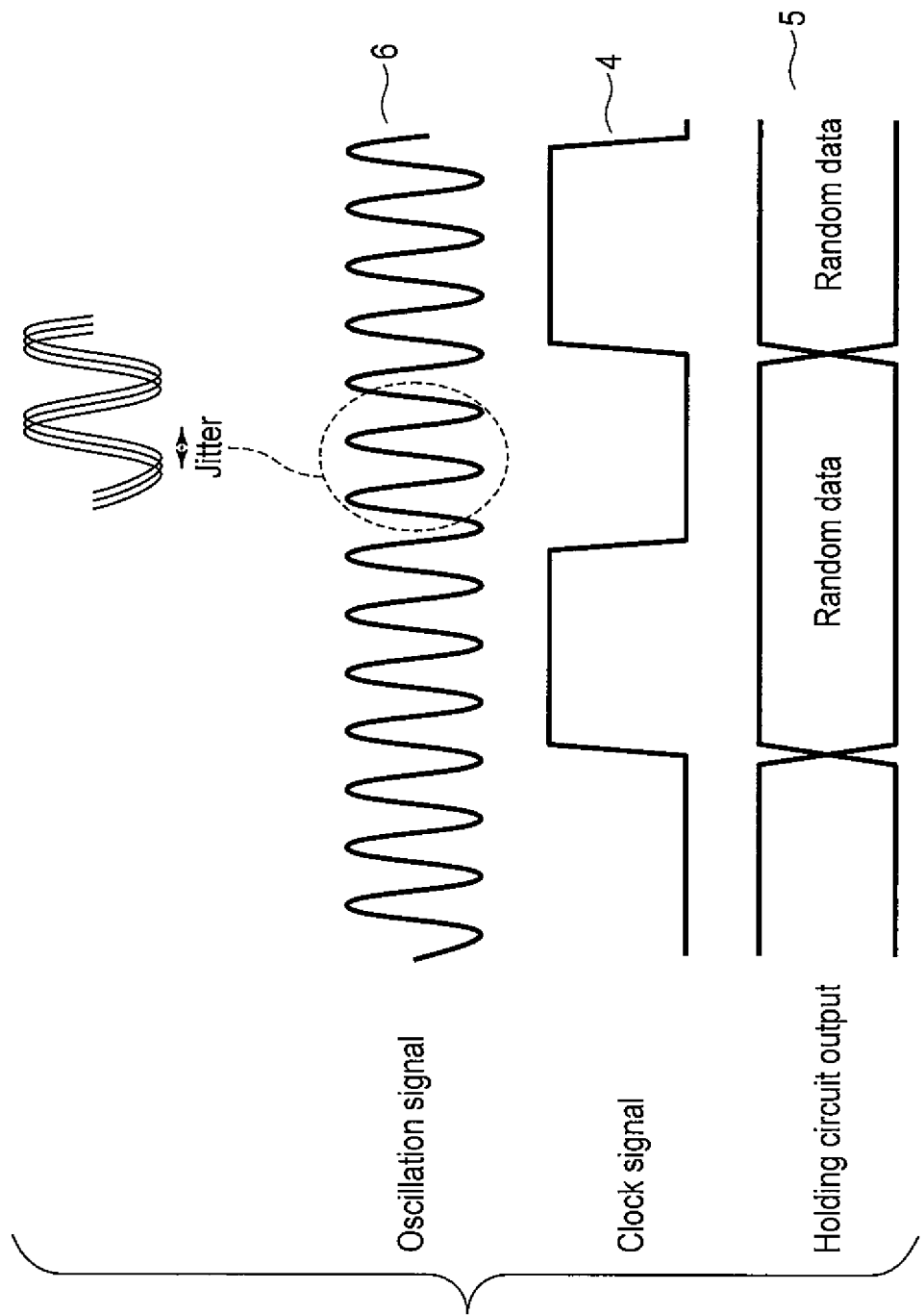
FIG. 2 is a timing chart showing a random data generation state.

In general, according to one embodiment, a random number generation circuit includes an oscillation circuit and a holding circuit. The oscillation circuit has an amplifier array and a high-noise circuit. A plurality of amplifiers is connected in series in the amplifier array, and the amplifier array has a terminal between neighboring amplifiers. The high-noise circuit is inserted between other neighboring amplifiers in the amplifier array, and the high-noise circuit generates noise required to generate jitter in an oscillation signal from the amplifier array. The holding circuit is connected to the terminal, holds the oscillation signal according to a clock signal having a frequency lower than an oscillation frequency of the oscillation signal. The holding circuit outputs, as a random number, the oscillation signal held according to the clock signal.

FIG. 1 is a block diagram showing a random number generation circuit according to an embodiment. A plurality of amplifiers 1a to 1c are wired in a ring pattern, and a high-noise circuit 2 is disposed to one wiring in the middle of them. The amplifier 1a has a first input terminal and a first output terminal. The amplifier 1b has a second input terminal and a second output terminal, and the second input terminal is connected to the first output terminal of the amplifier 1a. The amplifier 1c has a third input terminal and a third output terminal, and the third output terminal is connected to the first input terminal of the amplifier 1a. These amplifiers 1a to 1c configure an oscillation circuit, and the amplifier 1c outputs an oscillation signal. The plurality of amplifiers 1a to 1c are, for example, inverting amplifiers, and the oscillation circuit includes an odd number of amplifiers. The number of amplifiers is not limited to three shown in FIG. 1.

The high-noise circuit 2 has a fourth input terminal and fourth output terminal, the fourth input terminal is connected to the second output terminal of the amplifier 1b, and the fourth output terminal is connected to the third input terminal of the amplifier 1c. The high-noise circuit 2 generates noise required to generate jitter on the oscillation signal.

In this way, the plurality of amplifiers 1a to 1c wired in the ring pattern configure the oscillation circuit, and output an oscillation waveform 6. The high-noise circuit 2 inserted in the middle of the circuit is an element, a current to be flowed of which is limited to a small current. The output of the oscillation circuit is connected to an input of a holding circuit 3, and random data (random number) 5 is held and is output from the holding circuit 3 in response to an input timing of a clock 4. As a circuit for storing/holding data in response to clocks, for example, a D-flip-flop, transparent latch, or the like can be used. The following description will be given for a case in which a D-flip-flop triggered by a leading edge is used. Alternatively, other flip-flops or latches such as an edge trigger triggered by a trailing edge, flip-flops triggered by a leading edge, trailing edge, or both these edges, a JK flip-flop, transparent latch, or the like may be similarly used.

Using the high-noise circuit 2, noise which appears at an output terminal of the high-noise circuit 2 increases. Since the high-noise circuit 2 is arranged in the wiring in the middle of the oscillation circuit, a jitter magnitude of the oscillation signal 6 increases due to noise of the high-noise circuit 2. That oscillation signal 6 is latched using the clock 4, thereby obtaining the random data 5.

FIG. 2 is a timing chart showing a random data generation state. The oscillation signal 6 oscillates at a frequency higher than the clock signal 4, and includes large jitter due to the influence of the high-noise circuit 2. When a Low-to-High or High-to-Low transition timing of the oscillation signal 6 is simultaneous with a leading timing of the clock signal 4 or they are as close as the jitter magnitude, the output from the holding circuit 3 becomes random. When the oscillation frequency is low or jitter is small, since the clock timing matches the transition timing of the oscillation signal 6 with a low probability, a probability of generation of the random data 5 also becomes low. In this case, according to some methods to be described later, the transition timing of the oscillation signal 6 and the leading timing of the clock signal 4 are controlled to match, thereby increasing a generation probability of random data. However, the oscillation frequency is preferably higher than the clock frequency. By increasing jitter, easier control can be made.

FIG. 3 is a circuit diagram showing the high-noise circuit 2. The high-noise circuit 2 includes an NMOSFET 20 and PMOSFET 21, which are connected in series. These MOSFETs are connected to have a phase relationship opposite to that of a normal CMOS inverter with respect to a high-potential side power supply VDD and low-potential side power supply VSS. That is, the NMOSFET 20 includes a drain terminal connected to the VDD, a gate terminal connected to an input, a source terminal connected to an output, and a substrate terminal (not shown) connected to the VSS if substrate bias effect is not used. The PMOSFET 21 includes a drain terminal connected to the VSS, a gate terminal connected to the input, a source terminal connected to the output, and a substrate terminal (not shown) connected to the VDD if substrate bias effect is not used.

FIGS. 4A and 4B are circuit diagrams for explaining the operation of the high-noise circuit 2 shown in FIG. 3. A voltage value of an output Vout of the high-noise circuit 2 arranged in the oscillation circuit basically falls within a range of VSS<Vout<VDD. When a voltage of the VDD is applied to the input terminal, a voltage of VDD−Vout is applied across the gate and source of the two MOSFETs (20, 21). Since Vout>VSS, the NMOSFET 20 is set in a state in which it is applied with a small overdrive voltage compared to a normal CMOS inverter. On the other hand, the PMOSFET 21 is set in an OFF state. Hence, the output voltage rises toward the VDD side via the NMOSFET 20, but since the overdrive voltage of the NMOSFET 20 is small, a current to be flowed is small. When the gate-source voltage reaches a threshold voltage Vth, the NMOSFET 20 enters a sub-threshold region, and a current becomes smaller. When a voltage of the VSS is applied to the input terminal, a voltage of VSS−Vout is applied across the gate and source of the two MOSFETs (20, 21). Since VDD>Vout, the PMOSFET 21 is set in a state in which it is applied with a small overdrive voltage compared to a normal CMOS inverter. On the other hand, the NMOSFET 20 is set in an OFF state. Hence, the output voltage drops toward the VSS side via the PMOSFET 21, but since the overdrive voltage of the PMOSFET 21 is small, a current to be flowed is small. When the gate-source voltage reaches the threshold voltage Vth, the PMOSFET 21 enters a sub-threshold region, and a current becomes smaller.

As described above, the high-noise circuit 2 is characterized in that although its logic state is not changed, a current to be flowed is small. A small current to be flowed technically means a high channel resistance. Hence, a noise signal larger than that of a normal CMOS circuit appears on the output of this circuit.

Noise of a transistor is roughly classified into flicker noise and thermal noise. Flicker noise is dominant in a low-frequency region, and thermal noise is dominant in a high-frequency region. A corner frequency between these types of noise typically falls within a range of about several hundred kHz to several MHz. When the random number generation circuit is driven at several ten MHz to several hundred MHz, thermal noise is dominant. Current noise $I_{noise}$ due to thermal noise of a transistor is generally given by:

$$\overline{I_{noise}^2} = 4kT\gamma g_{ds}$$

where k is the Boltzmann constant, and T is an absolute temperature. $\gamma$ is a proportional coefficient, which becomes larger for a finer MOSFET. $g_{ds}$ is a channel conductance of a MOSFET. In the high-noise circuit according to this embodiment, since VSS<Vout<VDD, as described above, $|V_{gs}-V_{th}|<=|V_{ds}|$ (where $V_{gs}$ is a gate-source voltage, and $V_{ds}$ is a drain-source voltage) in an operation voltage range of the circuit. Therefore, the MOSFET basically operates in a saturation region, and in a sub-threshold region within a range of $|V_{gs}|<|V_{th}|$. The threshold voltage $V_{th}$ can be controlled by a substrate voltage.

Noise of the NMOSFET 20 will be estimated. The same applies to the PMOSFET 21. For the sake of simplicity, a drain current $I_d$ in the saturation region is expressed by:

$$I_d = \frac{1}{2}\mu C_{OX}\frac{W}{L}(V_{gs}-V_{th})^2(1+\lambda V_{ds})$$

where $\mu$ is a carrier mobility, $C_{ox}$ is a gate capacitance per unit area, W is a channel width, L is a channel length, and $\lambda$ is a channel length modulation coefficient. At this time, since a channel conductance is given by:

$$g_{ds} = \frac{1}{2}\mu C_{OX}\frac{W}{L}(V_{gs}-V_{th})^2 \cdot \lambda$$

a ratio of a noise current $I_{noise}$ generated around an average current $I_d$ is given by:

$$\overline{I_{noise}^2}/I_d^2 = \frac{8kT\gamma\lambda L}{\mu C_{OX}W} \cdot \frac{1}{(V_{gs}-V_{th})^2(1+\lambda V_{ds})^2}$$

This ratio becomes larger with decreasing $V_{gs}$ and $V_{ds}$. In a normal CMOS inverter, the source potential in the NMOSFET is the VSS. However, as can be seen from the above description, in the high-noise circuit 2 of this embodiment, since the source potential meets Vout>VSS, and both $V_{gs}$ and $V_{ds}$ become small, the ratio of noise becomes larger than the normal CMOS inverter.

FIG. 5 is a graph obtained by plotting noise current ratios when VDD=1.5 V, Vth=0.4 V, and Vin and Vout are changed. Since Vout is the source potential, Vout=0 V corresponds to a case of the normal CMOS inverter. As can be seen from FIG. 5, when Vin is given, noise ratios become larger than those in case of the CMOS for all cases of Vout. A delay of a CMOS circuit is decided by a current amount flowing through a transistor. In this case, an increase in ratio of noise with respect to an average current is to superpose noise on the delay of the CMOS circuit, that is, to increase jitter. As shown in FIG. 5, noise becomes larger with increasing Vout. This represents that noise becomes larger with decreasing $V_{ds}$, and in order to enhance this effect, a high-potential side power supply VDD2 and low-potential side power supply VSS2 to be applied to the high-noise circuit 2 may be set to meet VDD2<VDD and VSS2>VSS. Also, by applying a substrate bias, the threshold voltage |Vth| may be increased.

FIG. 6 shows estimation results of jitter magnitudes by circuit simulations using a 0.13-μ process transistor in a ring oscillator of three stages, which is configured using CMOS inverters as amplifiers (conventional oscillator) and the circuit in which the high-noise circuit 2 is inserted at one position between inverters (present embodiment). An elapsed time since the beginning of oscillation is plotted on the abscissa. As can be seen from FIG. 6, the present embodiment can generate jitter considerably larger than the conventional oscillator. This is because noise is superposed on a transmission delay of a signal since noise is superposed on a current flowing through the circuit when the signal passes through the high-noise circuit.

Note that the high-noise circuit 2 may be connected to any of positions between the neighboring amplifiers 1a to 1c or to a plurality of positions. Also, the connected position of the output of the oscillation circuit and the input of the holding circuit 3 may be any of the outputs of the amplifiers 1a to 1c and high-noise circuit 2, or a plurality of holding circuits 3 may be used for the respective outputs.

FIG. 7 shows an embodiment when a ring oscillator of CMOS inverters is used as a signal oscillation means. An oscillation circuit is configured by an odd number of CMOS inverters 70a to 70e which are connected in a ring pattern, and the high-noise circuit 2, and its output is latched by the holding circuit 3 in response to a given clock. Compared to a normal ring oscillator including only CMOS inverters, jitter components superposed on an oscillation signal increase since the high-noise circuit 2 is used. That is, generation efficiency of the random data 5 can be enhanced.

Since an average current flowing through the high-noise circuit 2 is smaller than the CMOS inverters 70, an average delay time of the high-noise circuit 2 is prolonged, and an oscillation frequency lowers accordingly. In this case, by decreasing the number of CMOS inverters 70a to 70e accordingly, an oscillation frequency can be raised. Finally, it can be designed to realize the same oscillation frequency as that when no high-noise circuit 2 is introduced. Also, the oscillation frequency can be raised by decreasing the threshold voltage |Vth| by changing the sub-threshold bias.

FIG. 7 shows the circuit diagram when the high-noise circuit 2 is applied to the CMOS ring oscillator. Since the high-noise circuit 2 does not change an input and output as logic values, it can be applied to various other oscillation circuits. For example, an arrangement shown in FIG. 8 may be used. That is, an oscillation circuit is configured using differential amplifiers 80a to 80d, and high-noise circuits 81a and 81b are inserted between the differential amplifiers 80b and 80c. In case of the differential amplifiers, an odd number of differential amplifiers may be connected intact, or even using an even number of differential amplifiers, an input/output relationship per pair may be replaced to configure an oscillation circuit. In FIG. 8, the high-noise circuits 81a and 81b are respectively connected to routes of two oscillation signals. Alternatively, these high-noise circuits may be connected to one of these routes. In FIG. 8, only one holding circuit 3 is used. However, since there are two oscillating signal routes, holding circuits 3 may be connected to both the routes, thus obtaining 2-bit random data.

Also, for example, as shown in FIG. 9, one of the inverters 70a to 70f is replaced by, for example, a NAND gate 90, and an oscillation start timing can be controlled using a trigger signal 91. The NAND gate 90 can be replaced by other logic gates such as a NOR gate, XOR gate, and the like. With this arrangement, for example, when the trigger signal 91 is controlled to be synchronized with a clock timing, the transition timing of the oscillation signal matches the timing of the clock 4, thus allowing easy generation of the random data 5. A plurality of timings of the trigger signal 91 with respect to the clock signal 4 are prepared, and an optimal timing can be selected. After a series of data are generated by selecting all of the plurality of timings for each clock 4, their XOR can be computed to obtain final random data 5. A method of attaining a plurality of timing can be implemented by a circuit which is configured to have a plurality of routes with different numbers of buffer circuits, and to select a signal route by a selector circuit.

In addition, a ring oscillator can be configured using a NAND gate or NOR gate. Also, the present embodiment is applicable to all oscillation circuits such as a circuit using an LCR delay, a voltage controlled oscillator (VCO) having an oscillation control terminal, and the like.

FIG. 10 shows an example in which a circuit having a Schmidt trigger input is connected to the output of the high-noise circuit. A Schmidt trigger inverter 100 is connected to the output of the high-noise circuit 2. Since a current is small in the high-noise circuit 2, a delay time of a signal which passes through the high-noise circuit 2 is relatively long in the oscillation circuit. For example, in case of a ring oscillator of CMOS inverters, since delays of other inverters are relatively short, and since a signal goes round to start a next signal transition before the output from the high-noise circuit 2 sufficiently changes, the output signal from the high-noise circuit 2 is unlikely to be fully swung. More specifically, since a current flowing through the high-noise circuit 2 becomes small, noise output from the high-noise circuit 2 cannot be sufficiently reflected on an oscillation cycle.

Since a threshold level of changes in output of the Schmidt trigger assumes different voltage values at High and Low, the output from the high-noise circuit 2 swings at least for that input voltage difference. For this reason, a relatively large current flows through the high-noise circuit 2, and noise is generated accordingly, thus superposing jitter on an oscillation signal. That is, the random data generation efficiency can be enhanced.

FIG. 11 shows an example of a voltage controlled oscillator in which one of a plurality of CMOS inverters that configure a CMOS ring oscillator is replaced by a voltage-controlled CMOS inverter. A voltage controlled oscillator 113 shown in FIG. 11 includes a plurality of CMOS inverters 110a to 110d, the high-noise circuit 2, and a CMOS inverter 111 having control terminals 112a and 112b to which control voltages required to control a delay are to be applied. In this case, only one of the plurality of CMOS inverters is replaced by the CMOS inverter 111, but a plurality or all of these CMOS inverters may be replaced by inverters each having the control terminals 112a and 112b like the CMOS inverter 111.

Using this arrangement, since an oscillation frequency can be controlled by control voltages to be applied to the control terminals 112a and 112b, the oscillation frequency which has changed due to application of the high-noise circuit 2 can be restored by the voltage control.

The arrangement shown in FIG. 11 has another merit. That is, an arrangement which can change control voltages according to a clock timing is available. In order to provide randomness to data latched by the holding circuit 3, it is most preferable that the leading timing of the clock 4 and the leading or trailing timing of the oscillation signal match or are as close as the jitter magnitude. However, since the voltage controlled oscillator 113 and clock 4 respectively independently operate, their timings do not normally match. In this case, by changing the oscillation frequency for respective clock timings by changing the control voltages of the voltage controlled oscillator 113, the timings can be matched at any oscillation frequency.

Figure 12:
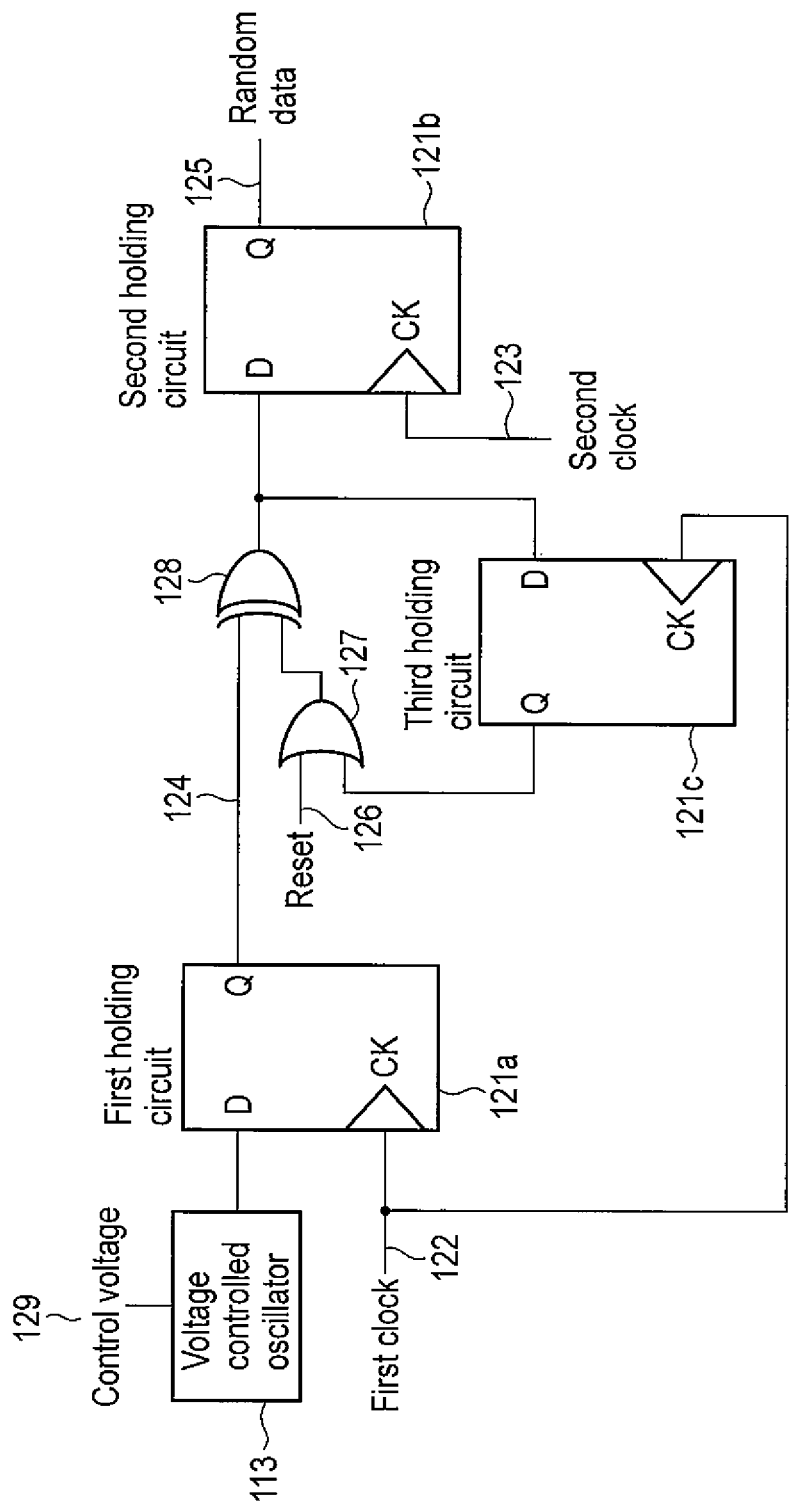
FIG. 12 is a circuit diagram showing a case in which generation certainty of random data is to be improved.

FIG. 12 shows a case in which the voltage controlled oscillator is used, and the generation certainty of random data is improved. In the arrangement of FIG. 12, the aforementioned holding circuit 3 is replaced by a first holding circuit 121a, XOR gate 128, second holding circuit 121b, third holding circuit 121c, and OR gate 127. The first holding circuit 121a holds an output from the voltage controlled oscillator 113 in accordance with a first clock 122. The output from the first holding circuit 121a is supplied to a first input of the XOR gate 128. A second input of the XOR gate 128 receives an output from the OR gate 127. The XOR gate 128 computes and outputs an XOR of the first and second inputs, that is, the outputs from the first holding circuit 121a and OR gate 127. The output from this XOR gate 128 is input to the second holding circuit 121b and third holding circuit 121c. The third holding circuit 121c holds the output from the XOR gate 128 in accordance with the first clock 122. The output from the third holding circuit 121c is input to the OR gate 127. The OR gate 127 computes and outputs an OR of the output from the third holding circuit 121c and a reset 126. The output of this OR gate 127 is connected to the second input of the XOR gate 128, as described above. The second holding circuit 121b holds the output from the XOR gate 128 in accordance with a second clock 123, and outputs random data 125. Assume that frequencies of the first and second clocks 122 and 123 are lower than an oscillation frequency of an oscillation signal in the voltage controlled oscillator 113.

The voltage controlled oscillator 113 shown in FIG. 12 is an oscillator which includes a high-noise circuit. After a series of data 124 are acquired by changing the oscillation frequency, since the timing of the first clock 122 and oscillation timing fall within a jitter magnitude range at some control voltage 129, the random data 125 is output at that timing.

Upon computing an exclusive OR (XOR) 128 of the series of data 124, even when a control voltage 129 at which the timings become close to each other cannot be detected, the output of the XOR 128 fetches elements of random data. Finally, upon completion of acquisition of the series of data 124, the second clock 123 goes High to output the final random data 125.

The reset 126 goes High after the final random data 125 is fetched in response to the second clock 123, thereby resetting a history of the series of data 124. In this case, the reset 126 is made by the OR gate 127, but may be made by a NOR gate. In this case, although a logic is inverted, no problem is posed since random number data is output. Of course, a NAND gate or AND gate may be used, or the third holding circuit 121c which feeds back its output may be replaced by a flip-flop with a reset terminal to reset the flip-flop. Such arrangements can be similarly attained if an appropriate logic signal is used as the reset signal 126.

According to this method, jitter components amplified by the high-noise circuit can be certainly fetched as random data. That is, the random data generation efficiency can be enhanced.

Figure 13:
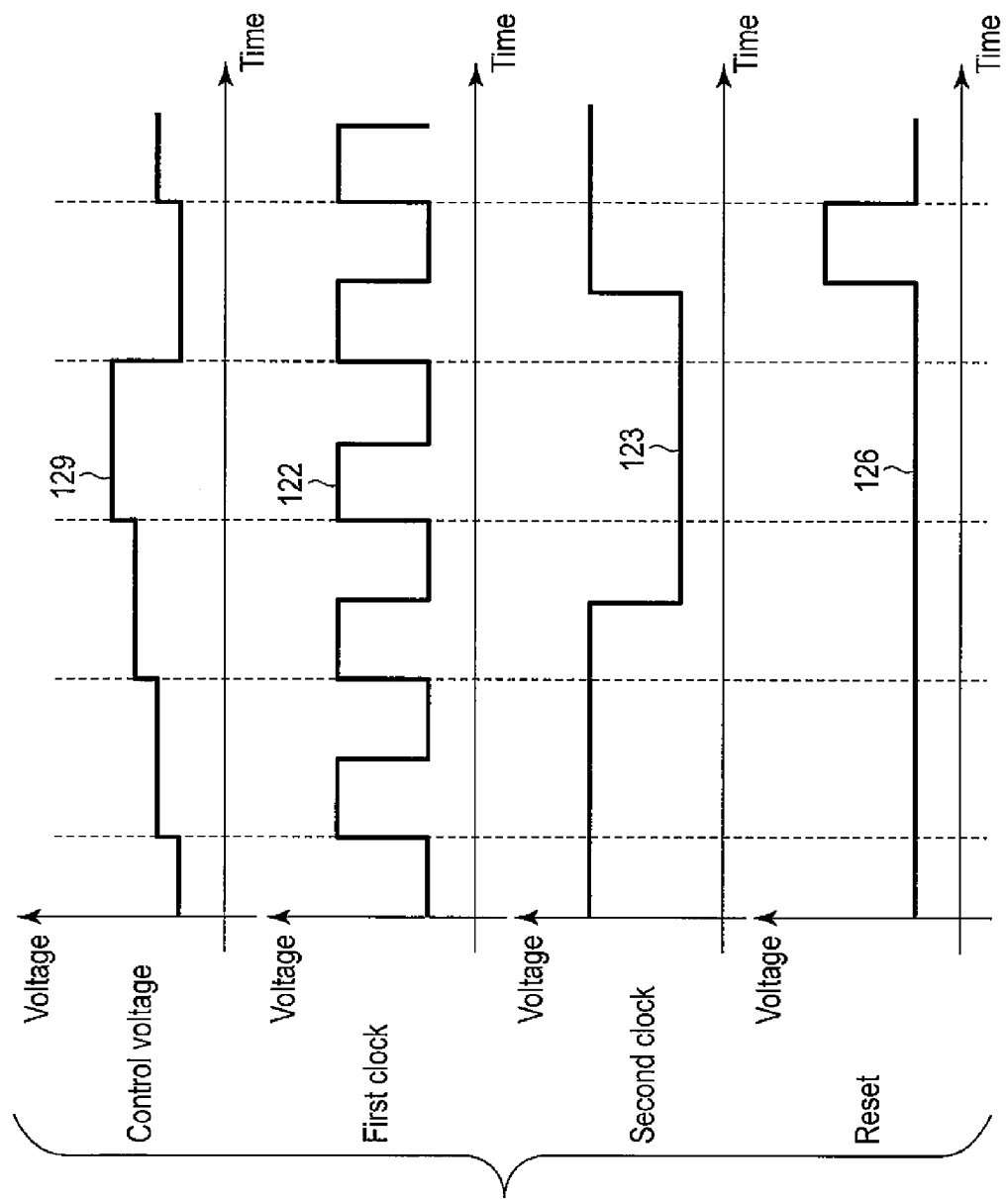
FIG. 13 is a timing chart showing a state of voltage control timings.

FIG. 13 is a timing chart showing a state of voltage control timings. At every timing of the first clock 122, random data is acquired by changing the magnitude of the control voltage 129. As the change width of the control voltage 129 is reduced, the timing of the first clock 122 and that of the oscillation fetch signals falling within the width of the jitter magnitude at a higher probability, thus enhancing the random data generation efficiency. Note that in FIG. 13, four clocks of the first clock 122 define one segment (reset), but the present embodiment is not limited to this. The control voltage 129 begins to change from a lowest voltage level again after one segment. Alternatively, a method of changing the control voltage 129 from a highest voltage level to a lower voltage level in the second round is available. The control voltage 129 is changed stepwise, but it may be changed continuously. The timing of the second clock 123 can be arbitrarily set without being synchronized with the first clock 122, and when data is periodically acquired at intervals of segments, each data can evenly include random data that fetches jitter components. The reset signal 126 is synchronized with the second clock signal 123, and erases a history of a series of data held by the XOR 128 to which data is fed back after the second holding circuit 121b fetches the data.

FIG. 14 shows the arrangement in which a check circuit 140 is added to the output from the first holding circuit 121a in the circuit shown in FIG. 12. For example, when the leading timing of the oscillation signal is to be synchronized with the first clock 122, if the first clock 122 is earlier than the oscillation signal, the output from the first holding circuit 121a is kept at Low; if the first clock 122 is later than the oscillation signal, the output from the first holding circuit 121a is kept at High. For example, when the control voltage 129 is controlled to gradually shorten an oscillation cycle, the clock timing shifts from an earlier timing to a later timing with respect to the leading edge of the oscillation signal. That is, when a change range of the control voltage 129 is correct, the output from the first holding circuit 121a changes from the output kept at Low to that kept at High. During acquisition of a series of data, whether or not this change takes place is checked, thus allowing to check whether or not random data is fetched. When the check circuit 140 cannot detect the aforementioned change, it judges that a random data fetching error has occurred, and externally outputs an error signal 141.

Conversely, a use method of the check circuit 140 which judges completion of fetching of random data when the aforementioned change has taken place, and changes the second clock 123 to High is also available. Also, the check circuit 140 may feed back to control the change range of the control voltage 129 so as to cause the aforementioned change.

Whether or not a state kept at Low changes to that kept at High can be detected using, for example, a counter circuit. For example, when a series of data are to be acquired using 10 clocks of the first clock 122, if all of 10 clocks are Low, a counter output is zero; if all of 10 clocks are High, a counter output is "10". For example, assuming that a counter output is "3", if one clock is judged as a random output, at least two High clocks are continuously output. Assuming that a counter output is "7", if one clock is judged as a random output, at least two Low clocks are continuously output. When an allowable counter output range is set, it can be used as a threshold of the check circuit. For example, such range can be set to judge that a range from 0.3n to 0.7n for the number n of clocks used to acquire a series of data is acceptable.

Figure 15:
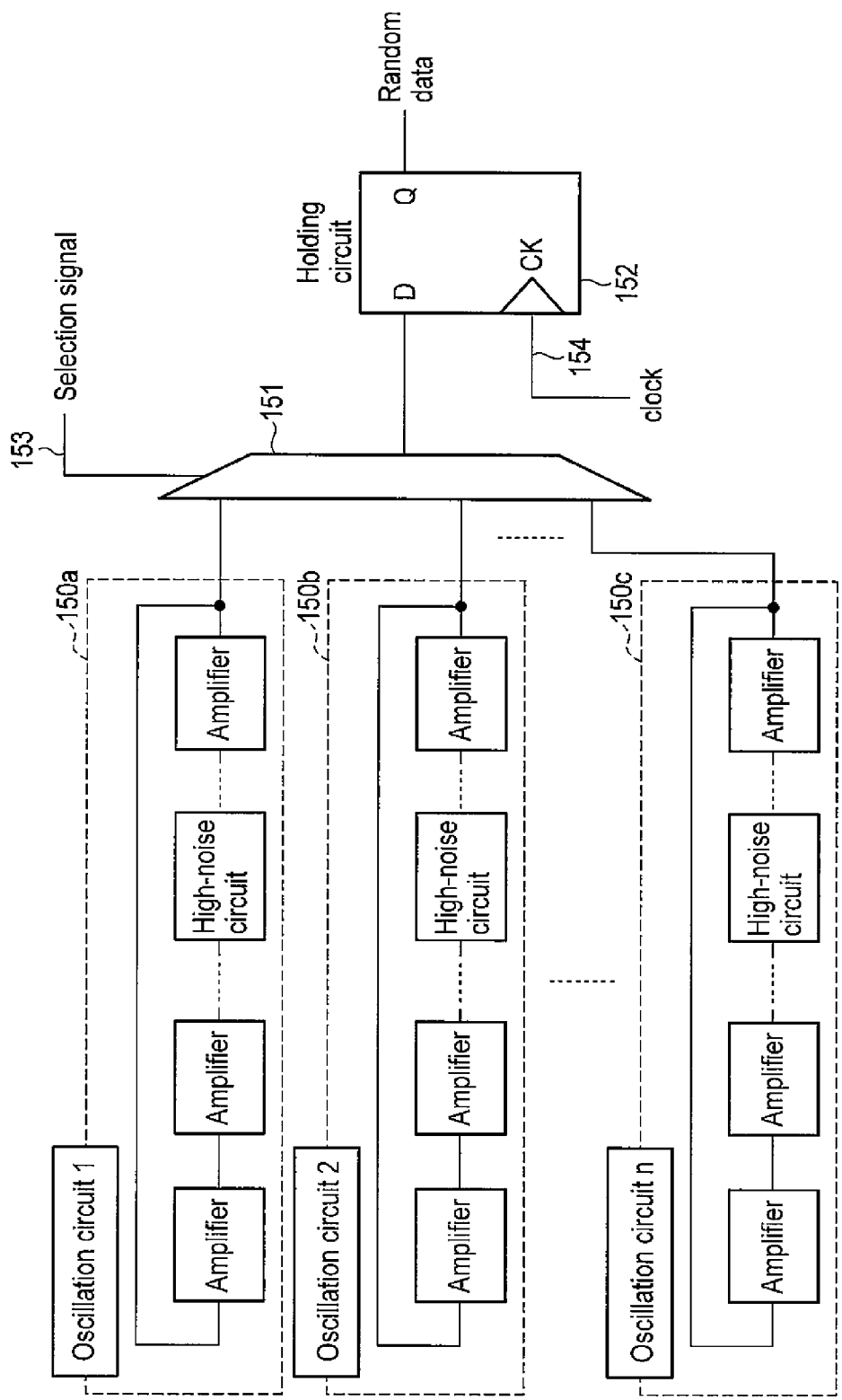
FIG. 15 is a circuit diagram showing the arrangement in which outputs from a plurality of oscillation circuits are selected.

The above description has been given in association with one oscillation circuit. Also, a plurality of oscillation circuits having the same arrangement can be prepared, as a matter of course. Holding circuits are respectively connected to the plurality of oscillation circuits to generate a plurality of random data. Alternatively, as shown in FIG. 15, signals from a plurality of oscillation circuits 150a to 150c may be selected by a selector 151, and the selected signal may be input to a holding circuit 152. Furthermore, the plurality of oscillation circuits 150a to 150c may be prepared by changing their fundamental frequencies little by little to optimize at least one of these circuits to generate random data, thereby enhancing the random data generation efficiency. When the holding circuits are respectively connected to the plurality of oscillators 150a to 150c, final random data is generated by computing an XOR of all or some of random data output from the plurality of holding circuits (not shown), thus certainly fetching data that holds jitter components. On the other hand, when the plurality of oscillation circuits 150a to 150c are selected by the selector 151, the selection signal 153 is sequentially switched for each clock 154, thereby fetching random data including jitter components in case of some selection signal 153. Hence, by generating final random data by computing an XOR of a series of data, the data that holds jitter components can be certainly fetched. Alternatively, the circuit may be controlled to check the output from the holding circuit, so as to always select an oscillation circuit that can fetch jitter components. The method of computing an XOR of a series of data, and the method of checking whether or not random data is fetched can use the circuits shown in FIGS. 12 and 14.

FIG. 16 shows another example of the high-noise circuit. This high-noise circuit includes a pass transistor 160 in which the source and drain terminals of an NMOSFET are respectively connected to an input and output, and a voltage Vb which meets VSS<Vb<VDD is applied to a gate terminal. FIG. 16 exemplifies the NMOSFET, but a PMOSFET can be used to configure the same arrangement. This high-noise circuit is advantageous in a small circuit scale. However, since the analog voltage Vb is required, if the system does not include any power supply that can output Vb, that power supply circuit has to be prepared additionally.

Note that the high-noise circuit shown in FIG. 3 has an advantage in that a high-resistance output can be made by only logic power supplies, and no additional circuit is required.

FIG. 17 shows still another example of the high-noise circuit. The source of an NMOSFET 170 is connected to a power supply 1, the drain is connected to a resistor, the gate is connected to an input, and the other terminal of the resistor is connected to a power supply 2. The power supply 1 is either VDD or VSS. The VDD or VSS, which is not the power supply 1, is used as the power supply 2. A substrate potential of the NMOSFET 170 is connected to the VSS if no substrate bias potential is used. The same arrangement can be configured using a PMOSFET in place of the NMOSFET. Note that in this circuit arrangement, an output signal is inverted with respect to an input.

When a high-resistance element is used as the resistor, large noise can be generated. For example, a well resistor, unsilicidated polysilicon gate, soft broken-down insulating film, and the like can be used. Although this circuit does not use any additional power supply, the well resistor or poly resistor normally requires a larger size compared to a transistor even when a resistance value remains the same. Also, the soft broken-down insulating film has an advantage in that it has a small size, and can automatically generate noise, but a circuit or wiring that causes soft breakdown has to be prepared in advance.

The high-noise circuit advantageously uses the circuits shown in FIGS. 16 and 17 depending on applications. However, in consideration of a more general use condition, the high-noise circuit advantageously uses the arrangement shown in FIG. 3.

When the high-noise circuit according to the embodiment of the present embodiment is inserted in the oscillation circuit, not only noise of the high-noise circuit appears as jitter of an oscillation signal, but also noise of the high-noise circuit is accumulated in every oscillation without disappearing. Using the high-noise circuit in addition to the conventional CMOS circuit, the number of oscillation times required to generate random data can be reduced, thus enhancing the random number generation efficiency. When the random number generation efficiency is enhanced, it is possible to generate a random number of the required number of bits by smaller electric power, thus attaining power savings of a semiconductor circuit.

The above description has been made under the precondition that the high-noise circuit is used in the oscillation circuit. Also, an arrangement in which jitter is superposed on an output from a clock signal generation circuit using the high-noise circuit or an arrangement in which jitter is superposed on both an oscillation signal and clock signal using the high-noise circuit, without modifying the oscillation circuit, is available.

For example, FIG. 18 shows an example in which a clock signal 180 is temporarily received by a CMOS inverter 181, the output of the CMOS inverter 181 is passed through a high-noise circuit 182, the output from the high-noise circuit 182 is inverted by an inverter 183 again, and the output from the inverter 183 is used as a clock input 185 required to generate random data 186 in a holding circuit 184. It should be noted that clock timings are different from other circuits due to a delay of the high-noise circuit 182. However, since the output is random data, no problem is posed even when the output timing is deviated every time from the clock 180 due to the delay. When the phase of the clock 180 is allowed to be deviated by half a cycle, since the high-noise circuit shown in FIG. 3 has the same input capacity as that of other CMOS inverters, an original clock signal may be received by the high-noise circuit 182 intact.

Other circuit arrangements described when the high-noise circuit is inserted in the oscillation circuit, for example, the arrangement using the Schmidt trigger and that using the voltage-controlled inverter can be similarly used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A random number generation circuit comprising:
an oscillation circuit which has an amplifier array in which a plurality of amplifiers are connected in series, and which has a terminal between neighboring amplifiers, and a high-noise circuit which is inserted between other neighboring amplifiers in the amplifier array, and generates noise required to generate jitter in an oscillation signal from the amplifier array; and a holding circuit which is connected to the terminal, holds the oscillation signal according to a clock signal having a frequency lower than an oscillation frequency of the oscillation signal, and outputs, as a random number, the oscillation signal held according to the clock signal, wherein the high-noise circuit comprises:

an NMOS transistor which has a first gate terminal, a first source terminal, and a first drain terminal, and in which the first drain terminal is connected to a high-potential side power supply and; and a PMOS transistor which has a second gate terminal, a second source terminal, and a second drain terminal, and in which the second drain terminal is connected to the low-potential side power supply, the second gate terminal is connected to the first gate terminal, and the second source terminal is connected to the first source terminal.

2. The circuit according to claim 1, wherein the NMOS transistor further has a first substrate terminal connected to the low-potential side power supply, and the PMOS transistor further has a second substrate terminal connected to the high-potential side power supply.

3. The circuit according to claim 1, wherein the amplifiers are CMOS inverters.

4. The circuit according to claim 1, wherein at least one of the amplifiers comprises a control terminal used to control a delay of the oscillation signal according to a control voltage.

5. A random number generation circuit comprising:

an oscillation circuit which has an amplifier array in which a plurality of amplifiers are connected in series, and which has a terminal between neighboring amplifiers, and a high-noise circuit which is inserted between other neighboring amplifiers in the amplifier array, and generates noise required to generate jitter in an oscillation signal from the amplifier array; and a holding circuit which is connected to the terminal, holds the oscillation signal according to a clock signal having a frequency lower than an oscillation frequency of the oscillation signal, and outputs, as a random number, the oscillation signal held according to the clock signal, wherein the holding circuit comprises:

a first holding circuit which holds and outputs the oscillation signal according to a first clock having a frequency lower than the oscillation frequency of the oscillation signal; an XOR gate which is connected to an output of the first holding circuit;

a second holding circuit which is connected to an output of the XOR gate, holds the output from the XOR gate according to a second clock having a frequency lower than the oscillation frequency of the oscillation signal, and outputs the held output as a random number; and a third holding circuit which is connected to the output of the XOR gate, and holds and outputs the output from the XOR gate according to the first clock; and an OR gate which computes and outputs a logical sum of an output from the third holding circuit and a reset, and the XOR gate computes an exclusive OR operation of an output from the OR gate and the output from the first holding circuit.

6. The circuit according to claim 5, further comprising a check circuit which is connected to the output of the first holding circuit, and outputs an error signal.

* * * * *